(12) United States Patent
Yamamoto

(10) Patent No.: US 8,324,799 B2
(45) Date of Patent: Dec. 4, 2012

(54) LIGHT EMITTING DEVICE

(75) Inventor: Kyoko Yamamoto, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 357 days.

(21) Appl. No.: 12/090,257

(22) PCT Filed: Oct. 18, 2006

(86) PCT No.: PCT/JP2006/321190
§ 371 (c)(1),
(2), (4) Date: Apr. 15, 2008

(87) PCT Pub. No.: WO2007/046531
PCT Pub. Date: Apr. 26, 2007

(65) Prior Publication Data
US 2010/0156275 A1    Jun. 24, 2010

(30) Foreign Application Priority Data

Oct. 20, 2005    (JP) ................................. 2005-305419

(51) Int. Cl.
*H01L 51/54*    (2006.01)
*H05B 33/02*    (2006.01)

(52) U.S. Cl. ...................................... 313/504; 313/498

(58) Field of Classification Search .......... 313/495–512, 313/487–488, 581–587, 493
See application file for complete search history.

(56) References Cited

U.S. PATENT DOCUMENTS

| 6,538,375 | B1 | 3/2003 | Duggal et al. |
| 6,633,117 | B2 * | 10/2003 | Shinoda et al. ............... 313/484 |
| 2002/0031315 | A1 | 3/2002 | Cheng et al. |
| 2003/0099858 | A1 | 5/2003 | Duggal et al. |
| 2005/0088079 | A1 | 4/2005 | Daniels |

FOREIGN PATENT DOCUMENTS

| EP | 1437616 A1 | 1/2003 |
| JP | 2000-298443 A | 10/2000 |
| JP | 2002-184580 A | 6/2002 |
| JP | 2002-184582 A | 6/2002 |
| JP | 2002-319484 A | 10/2002 |
| JP | 2002319484 A * | 10/2002 |
| JP | 2005-174647 A | 6/2005 |
| JP | 2006-12760 A | 1/2006 |

OTHER PUBLICATIONS

Japanese Office Action for Application No. 2006-282294 mail date Apr. 17, 2012.
Japanese Office Action for Application No. 2006-282294 mail date Oct. 18, 2011.

* cited by examiner

*Primary Examiner* — Anh Mai
*Assistant Examiner* — Elmito Breval
(74) *Attorney, Agent, or Firm* — Sughrue Mion, PLLC

(57) ABSTRACT

The present invention provides a light emitting device with high brightness. The light emitting device comprises a fiber core, a first electrode, a light emitting layer and a second electrode in this order wherein the light emitting layer is on at least one selected from the fiber core and the first electrode, the second electrode is opaque, and is on a periphery of the light emitting layer and covers not less than 30% and not more than 80% of a periphery of the light emitting layer.

19 Claims, 9 Drawing Sheets

LIGHT EMITTING DEVICE

TECHNICAL FIELD

The present invention relates to a light emitting device. More particularly, the present invention relates to a light emitting device with high brightness.

BACKGROUND ART

Light emitting devices are used for a display such as an organic EL display, inorganic EL display and flexible display and lighting.

As the light emitting device, for example, light emitting devices having a fiber core, cathode, light emitting layer and anode are known (for example, JP-A-2002-184580).

However, when the light emitting device described in the above-described publication is used for a display or lighting, the emitting efficiency is low and the brightness is not sufficient.

DISCLOSURE OF THE INVENTION

An object of the present invention is to provide a light emitting device with high brightness. The present inventors have intensively studied to solve the above-described problem, and resultantly led to completion of the present invention.

That is, the present invention provides a light emitting device comprising a fiber core, a first electrode, a light emitting layer and a second electrode in this order wherein the light emitting layer is on at least one selected from the fiber core and the first electrode, the second electrode is opaque, is on a periphery of the light emitting layer and covers not less than 30% and not more than 80% of the periphery of the light emitting layer.

DESCRIPTION OF THE REFERENCE NUMERALS

Figure 1:
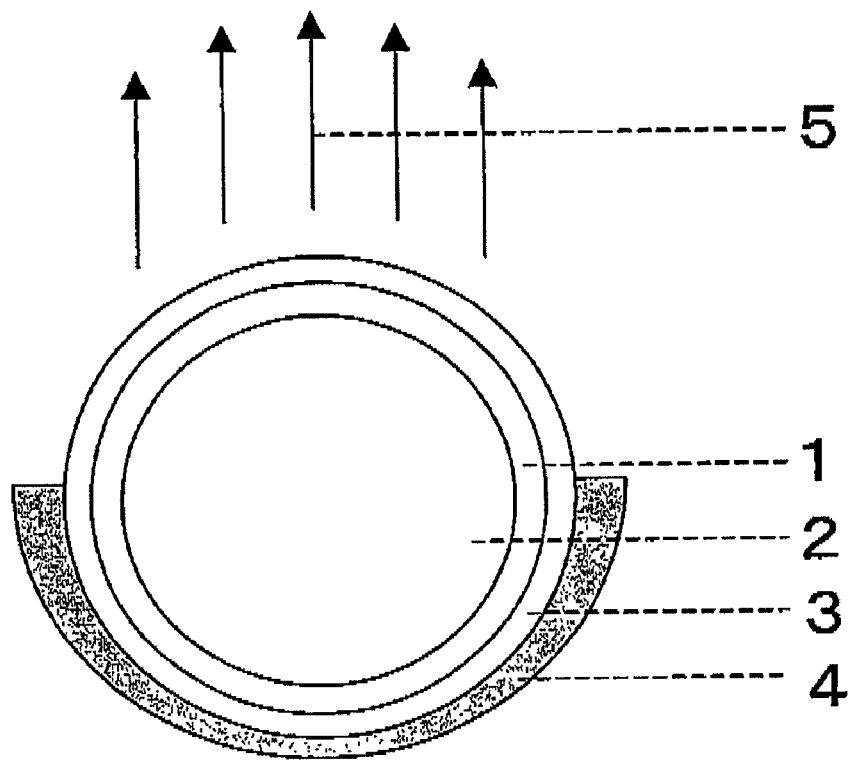
FIG. 1 shows a cross-sectional view of the light emitting device of embodiment 1.

1: first electrode
2: fiber core
3: light emitting layer
4: second electrode
5: emitting direction
6: longitudinal direction

MODES FOR CARRYING OUT THE INVENTION

1. Light Emitting Device

The light emitting device of the present invention includes a fiber core, a first electrode, a light emitting layer and a second electrode, and the second electrode is present on a part of the light emitting layer. The light emitting device including these components shows high brightness. The light emitting device may further include a gas barrier layer.

Each of components will be described below.

Fiber Core

The fiber core may advantageously be one capable of imparting mechanical strength and flexibility necessary for functioning as a light emitting device. The fiber core is made of, for example, metal, glass or plastic.

The fiber core is preferably transparent (for example, light transmittance: not less than 50%) for light from a light emitting layer described later, from the standpoint of improvement in light emitting property.

Examples of the metal include aluminum, chromium, gold, platinum and silver.

Examples of the plastic include polyolefins such as polyethylene (low density, high density), ethylene-propylene copolymer, ethylene-butene copolymer, ethylene-hexene copolymer, ethylene-octene copolymer, ethylene-norbornene copolymer, ethylene-domon copolymer, polypropylene, ethylene-vinyl acetate copolymer, ethylene methyl methacrylate copolymer and ionomer resin; polyesters such as polyethylene terephthalate, polybutylene terephthalate and polyethylene naphthalate; nylon-6, nylon-6,6, metaxylenediamine-adipic acid poncondensate; amide resins such as polymethylmethacrylimide; acrylic resins such as polymethyl methacrylate; styrene-acrylonitrile resins such as polystyrene, styrene-acrylonitrile copolymer, styrene-acrylonitrile-butadiene copolymer and polyacrylonitrile; hydrophobicized cellulose resins such as cellulose triacetate and cellulose diacetate; halogen-containing resins such as polyvinyl chloride, polyvinylidene chloride, polyvinylidene fluoride and polytetrafluoroethylene; hydrogen-bonding resins such as polyvinyl alcohol, ethylene-vinyl alcohol copolymer and cellulose derivative; polycarbonates; polysulfones; polyether sulfones; polyether ether ketones; polyphenylene oxides; polymethylene oxides; and liquid crystalline resins. Of these plastics, preferable are ethylene-norbornene copolymer, ethylene-domon copolymer, polyethylene terephthalate, polyethylene naphthalate, polycarbonates, polysulfones, polyether sulfones, polyether ether ketones and liquid crystalline resins, because of high heat resistance.

The fiber core usually has a cross-sectional shape of circle, ellipse or polygon (triangle, rectangle and the like), alternatively, may have a hollow shape such as cylinder. The fiber core has, for example, a shape of thread or ribbon. The fiber core has a cross section correspondent diameter (for example, if the cross section is circle, the diameter thereof, if the cross section is isosceles triangle, the diameter of a circle having the same area as its cross sectional area, if the cross section is rectangle, the diameter of a circle having the same area as its cross sectional area) of usually from 10 μm to 10 mm, and from the standpoints of flexibility and strength, preferably from 100 μm to 5 mm.

The fiber core's periphery may have an asperity from the standpoint of enhancing the brightness of a light emitting device, and it is preferable that asperity is present on the light emitting direction periphery.

First Electrode

The first electrode is on a fiber core, and usually placed continuously along the longitudinal direction of the fiber core. The electrode may be placed so as to cover all the fiber core face, or may be placed so as to cover a part of the face. When the electrode is not placed on the light emitting direction periphery of a light emitting device, the resultant light emitting device shows high brightness in some cases.

When the first electrode is used as an anode, the electrode is made of an electrically conductive metal oxide (for example, indium oxide, zinc oxide, tin oxide, indium tin oxide ITO, indium zinc oxide), metal (for example, gold, platinum, silver, copper) or electrically conductive organic compound (for example, polyaniline or its derivative, polythiophene or its derivative). Placing of the electrode made of an electrically conductive metal oxide or metal oxide may be carried out, for example, using vacuum vapor deposition, sputtering, ion plating or plating. Placing of the electrode made of an electrically conductive organic compound may be carried out, for example, using deposition or application (for example, inkjet).

In contrast, when the first electrode is used as a cathode, the electrode is, for example, a metal such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, an alloy composed of these metals, an alloy composed of at least one of these metals and at least one selected from gold, silver, platinum, copper, manganese, titanium, cobalt, nickel, tungsten and tin, graphite or graphite intercalation compound. Placing of the electrodes may be carried out, for example, using vacuum vapor deposition, sputtering, ion plating or plating.

The first electrode is preferably used as an anode.

The first electrode may be constituted of substantially the same material as that of the fiber core, or may be integrated. The fiber core in this example is made of aluminum, and also the first electrode is made of aluminum.

The first electrode is preferably transparent (for example, light transmittance: not less than about 50%) for light from a light emitting layer described later, from the standpoint of enhancing brightness of a light emitting device. When the electrode is made of an opaque material, the thickness of the material may be thinner, alternatively for reducing resistance, a transparent material may be formed on the electrode.

The first electrode has a thickness of usually not less than 50 nm, preferably not less than 100 nm and usually not more than 500 nm, preferably not more than 300 nm.

Light Emitting Layer and Related Layers

The light emitting layer is on the fiber core or the first electrode, and usually, it is placed on a periphery of the fiber core, on a periphery of the first electrode, or on both the periphery of the fiber core and the periphery of the first electrode. The light emitting layer may cover a part or all of the periphery, and preferably, covers all of the periphery.

The light emitting layer may advantageously be one emitting light by application of electric current, and may be made of any of inorganic compounds and organic compounds. The light emitting layer is preferably made of an organic compound from the standpoint of flexibility of a light emitting device.

When the light emitting layer is made of the organic compound, the light emitting layer includes an organic light emitting layer, and usually, includes an electron transportation layer and a hole transportation layer in addition to the organic light emitting layer. The light emitting layer may include two or more organic light emitting layers.

The organic light emitting layer is made of a low molecular weight compound or a high molecular weight compound, and from the standpoint of easiness of application, preferably made of a high molecular weight compound. The low molecular weight compound is, for example, a compound described in JP-A-57-51781 and JP-A-59-194393, and includes naphthalene derivatives, anthracene or its derivatives, perylene or its derivatives; polymethine, xanthene, coumarin and cyanine coloring matters; metal complexes of 8-hydroxyquinoline or its derivatives, aromatic amines, tetraphenylcyclopentadiene or its derivatives, and tetraphenylbutadiene or its derivatives. Formation of an organic light emitting layer made of a low molecular weight compound may be carried out, for example, by vacuum vapor deposition using a low molecular weight compound powder. Examples of the high molecular weight compound includes poly(p-phenylenevinylene), polyfluorene {Japanese Journal of Applied Physics, vol. 30, L1941 (1991)}, poly-p-phenylene derivative {Advanced Materials, vol. 4, p. 36 (1992)} and the like. Formation of an organic light emitting layer from a high molecular weight compound may be carried out, for example, by a method of applying a solution including a high molecular weight compound and drying this, or a method of dipping a member (including fiber core and first electrode) in a solution including a high molecular weight compound and drying this.

The organic compound to be used in an electron transportation layer includes oxadiazole derivatives, anthraquinodimethane or its derivatives, benzoquinone or its derivatives, naphthoquinone or its derivatives, anthraquinone or its derivatives, tetracyanoanthraquinone or its derivatives, fluorenone derivatives, diphenyldicyanoethylene or its derivatives, diphenoquinone derivatives, metal complexes of 8-hydroxyquinoline or its derivatives, polyquinoline or its derivatives, polyquinoxaline or its derivatives, and polyfluorene or its derivatives. Formation of an electron transportation layer may be carried out, for example, by vacuum vapor deposition using an organic compound powder, a method of applying a solution including an organic compound and drying this, or a method of dipping a member in a solution including an organic compound and drying this.

The organic compound to be used in a hole transportation layer includes polyvinyl carbazole or its derivatives, polysilane or its derivatives, polysiloxane derivatives having an aromatic amine compound group on the side chain or main chain, polyaniline or its derivatives, polythiophene or its derivatives, poly(p-phenylenevinylene) or its derivatives, and poly(2,5-thienylenevinylene) or its derivatives. Formation of a hole transport layer may be carried out, for example, by a method of applying a mixed solution including an organic compound and a high molecular weight binder and drying this, or a method of dipping a member in a mixed solution including an organic compound and a high molecular weight binder and drying this.

A light emitting device including an electron transportation layer and hole transportation layer formed has, for example, a structure in which an electron transportation layer is between a cathode and an organic light emitting layer (anode/organic light emitting layer/electron transportation layer/cathode)(/means adjacent lamination of layers), a structure in which a hole transportation layer is between an anode and an organic light emitting layer (anode/hole transportation layer/organic light emitting layer/cathode), or a structure in which an electron transportation layer is between a cathode and an organic light emitting layer and a hole transportation layer is between an anode and an organic light emitting layer (anode/hole transportation layer/organic light emitting layer/electron transportation layer/cathode).

Emitting color of a light emitting layer may be altered by appropriate selection from the above-described compounds, and for example, may be set to red, green or blue. For obtaining a given emitting color, compounds showing mutually different colors may be combined and the light emitting layers each including the compound may be laminated.

The light emitting layer has a thickness of usually not less than 80 nm, preferably not less than 100 nm and usually not more than 400 nm, preferably not more than 250 nm.

Second Electrode

The second electrode is on a periphery of the light emitting layer and covers not less than 30% and not more than 80% of the a periphery of the light emitting layer, as described above. When the coverage is too small, the light emitting layer has fewer aperture area, leading to insufficient light extraction and insufficient brightness. Also when the coverage is too large, the quantity of light emission in the light emitting device is smaller, leading to insufficient brightness. The coverage of the second electrode is preferably not less than 50% and not more than 75% of the periphery of the light emitting layer.

The electrode may be placed in the form of island on the periphery of the light emitting layer, or may be placed in the form of belt continued along the longitudinal direction. Even if the electrode is placed in the form of island, it is preferable that islands are mutually connected for electric conduction. It is preferable that the electrode is placed so as to give an aperture area in a specific one direction vertical to the longitudinal direction of a light emitting device (when the cross section of a light emitting device is circle, radius direction), from the standpoint of enhancing the directivity of emitting light.

The electrode is opaque, and permits substantially no transmission (for example; light transmittance: not more than 10%) of light from a light emitting layer and the electrode preferably reflects light. In a light emitting device including such an electrode, light is emitted from parts on which the second electrode is not placed on the periphery of the light emitting device, showing high brightness.

When the second electrode is used as an anode, the electrode is made of electrically conductive metal oxide (for example, indium oxide, zinc oxide, tin oxide, indium tin oxide ITO, indium zinc oxide), metal (for example, gold, platinum, silver, copper) or electric conductive organic compound (for example, polyaniline or its derivative, polythiophene or its derivative), preferably, gold, platinum, silver or copper. Placing of the electrode made of the electrically conductive metal oxide or metal oxide may be carried out, for example, using vacuum vapor deposition, sputtering, ion plating or plating. Placing of the electrode made of the electrically conductive organic compound may be carried out, for example, using deposition or application (for example, ink-jet).

In contrast, when the second electrode is used as a cathode, the electrode is a metal selected from lithium, sodium, potassium, rubidium, cesium, beryllium, magnesium, calcium, strontium, barium, aluminum, scandium, vanadium, zinc, yttrium, indium, cerium, samarium, europium, terbium and ytterbium, an alloy composed of them, an alloy composed of at least one of these metals and at least one selected from gold, silver, platinum, copper, manganese, titanium, cobalt, nickel, tungsten and tin, graphite or graphite intercalation compound. Placing of the electrode may be carried out, for example, using vacuum vapor deposition, sputtering, ion plating or plating.

The second electrode is preferably used as a cathode.

Placing of the electrode may be carried out by patterning means such as masking and resist work in combination. By a combination of patterning means, the shape of an aperture area may be adjusted, and light emitting devices having an aperture area (portion on which a second electrode is not placed of a periphery of a light emitting layer) in the form of, for example, rectangle, square or circle are obtained as described later.

The second electrode has a thickness of usually not less than 30 nm, preferably not less than 80 nm and usually not more than 500 nm, preferably not more than 300 nm.

In the light emitting device, one of the first electrode and the second electrode is an anode, and another is a cathode, and preferably, the first electrode is an anode and the second electrode is a cathode.

In the light emitting device, the first electrode and the second electrode are usually continuous along the longitudinal direction of fiber.

The light emitting device usually includes a connection portion (terminal) for supplying electricity to the first electrode and the second electrode. The terminal is preferably on the end face of the light emitting device.

Gas Barrier Layer

The gas barrier layer is made of a material having a gas barrier property. For example, the gas barrier layer is transparent and on a periphery excluding terminals of electrodes, transparent. As the material having a gas bather property, various inorganic materials and organic materials are used. Examples of the inorganic material include a metal such as aluminum, copper and nickel; metal oxide such as silica, alumina, titania, indium oxide, tin oxide, titanium oxide and zinc oxide; metal nitride such as aluminum nitride and silicon nitride; metal carbide such as silicon carbide; or metal oxynitride such as silicon oxynitride; preferably, alumina, aluminum nitride, silicon nitride or silicon oxynitride (SiON), further preferably, silicon oxynitride. These may be used singly or in combination. Formation of a gas barrier layer made of the inorganic material may be carried out, for example, using vacuum vapor deposition, CVD, sputtering and sol-gel method. Examples of the organic material include a polyolefin such as polyethylene (low density; high density), ethylene-propylene copolymer, ethylene-butene copolymer, ethylene-hexene copolymer, ethylene-octene copolymer, ethylene-norbornene copolymer, ethylene-domon copolymer, polypropylene, ethylene-vinyl acetate copolymer, ethylene-methyl methacrylate copolymer and ionomer resin; polyester such as polyethylene terephthalate, polybutylene terephthalate and polyethylene naphthalate; nylon-6, nylon-6,6, metaxylenediamine-adipic acid poncondensate; amide resin such as polymethylmethacrylimide; acrylic resin such as polymethyl methacrylate; styrene-acrylonitrile resin such as polystyrene, styrene-acrylonitrile copolymer, styrene-acrylonitrile-butadiene copolymer and polyacrylonitrile; hydrophobicized cellulose resin such as cellulose triacetate and cellulose diacetate; halogen-containing resin such as polyvinyl chloride, polyvinylidene chloride, polyvinylidene fluoride and polytetrafluoroethylene; hydrogen-bonding resin such as polyvinyl alcohol, ethylene-vinyl alcohol copolymer and cellulose derivative; polycarbonate; polysulfone; polyether sulfone; polyether ether ketone; polyphenylene oxide; polymethylene oxide; or liquid crystalline resin, and from the standpoint of heat resistance, preferably ethylene-norbornene copolymer, ethylene-demon copolymer, polyethylene terephthalate, polyethylene naphthalate, polycarbonate, polysulfone, polyether sulfone, polyether ether ketone or liquid crystalline resin. Formation of a gas barrier layer made of the organic material may be carried out, for example, by a method of applying a coating solution containing an organic material, and drying and thermally treating this (for example, coating such, as dip coating). The gas barrier layer may be one obtained by laminating a layer made of the organic material and a layer made of the inorganic material from the standpoint of improving flexibility of a light emitting device, and for example, these may be laminated alternately to give a gas barrier layer.

Next, embodiments of a light emitting device of the present invention will be illustrated using drawings.

Embodiment 1

FIG. 1 shows a cross section (face vertical to the longitudinal direction) of a light emitting device. In the light emitting device in FIG. 1, a first electrode 1 and a light emitting layer 3 are placed on a fiber core 2 having a circular cross section. A second electrode reflecting light is placed so as to cover about 50% (lower portions in FIG. 1) of a periphery of the light emitting layer 3. In the light emitting device, the light emitting layer 3 shows light emission when voltage is applied on the electrodes (first electrode and second electrode). A part of light emitted from the light emitting layer 3 is emitted through parts (upper portions in FIG. 1) on which the second electrode 4 is not placed of a periphery of the light emitting layer 3, and a part thereof is emitted toward emission direction 5 from parts on which the second electrode 4 is not placed of a periphery of the light emitting layer 8 via the fiber core 2 or the first electrode 1. Other parts reach the second electrode 4 and are reflected, and emitted toward emission direction 5 from parts on which the second electrode is not placed of a periphery of the light emitting layer 3 via the fiber core 2, the first electrode 1 or the light emitting layer 3.

Embodiment 2

Figure 2:
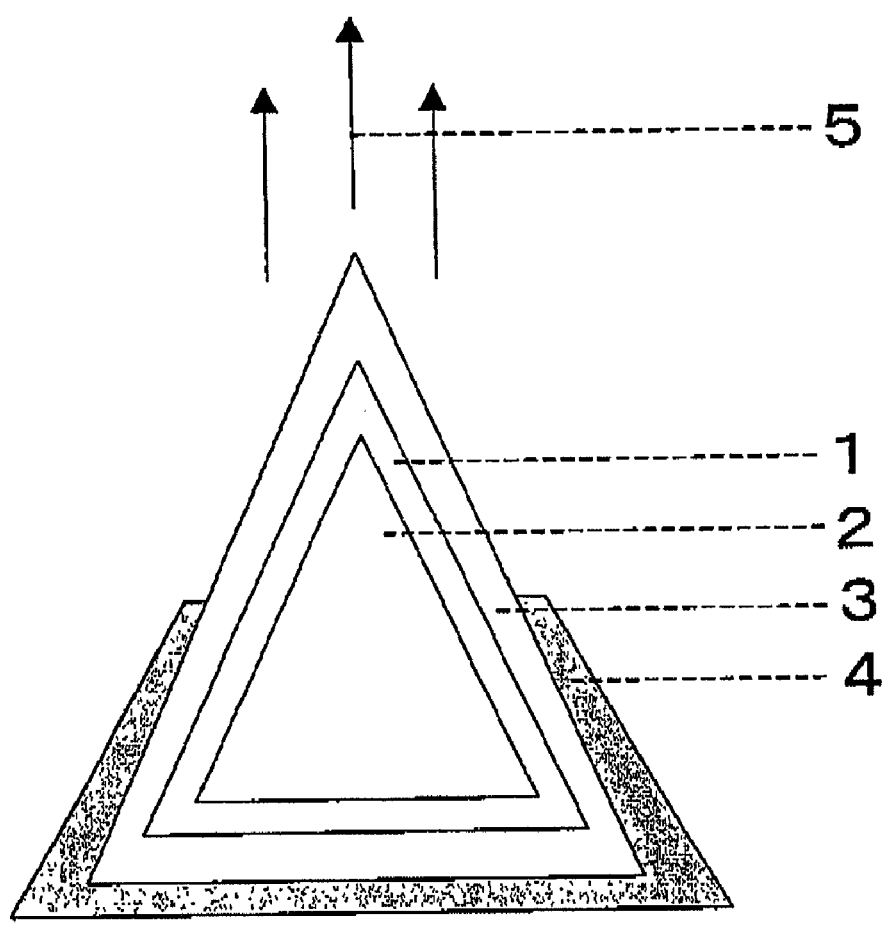
FIG. 2 shows a cross-sectional view of the light emitting device of embodiment 2.

In a light emitting device in FIG. 2, a first electrode 1 and a light emitting layer 3 are placed on a fiber core 2 having an isosceles triangle cross section. A second electrode reflecting light is placed so as to cover about 70% (lower portions in FIG. 2) of a periphery of the light emitting layer 3. The light emitting layer 3 shows light emission when voltage is applied on the electrodes of the light emitting device. A part of light emitted from the light emitting layer 3 is emitted from parts (upper portions in FIG. 2) on which the second electrode 4 is not placed of a periphery of the light emitting layer 3, and a part thereof is emitted toward emission direction 6 from parts on which the second electrode 4 is not placed of a periphery of the light emitting layer 3 via the fiber core 2 or the first electrode 1. Other parts reach the second electrode 4 and are reflected, and emitted toward emission direction 5 from parts on which the second electrode is not placed of a periphery of the light emitting layer 3 via the fiber core 2, the first electrode 1 or the light emitting layer 3.

Embodiment 3

Figure 3:
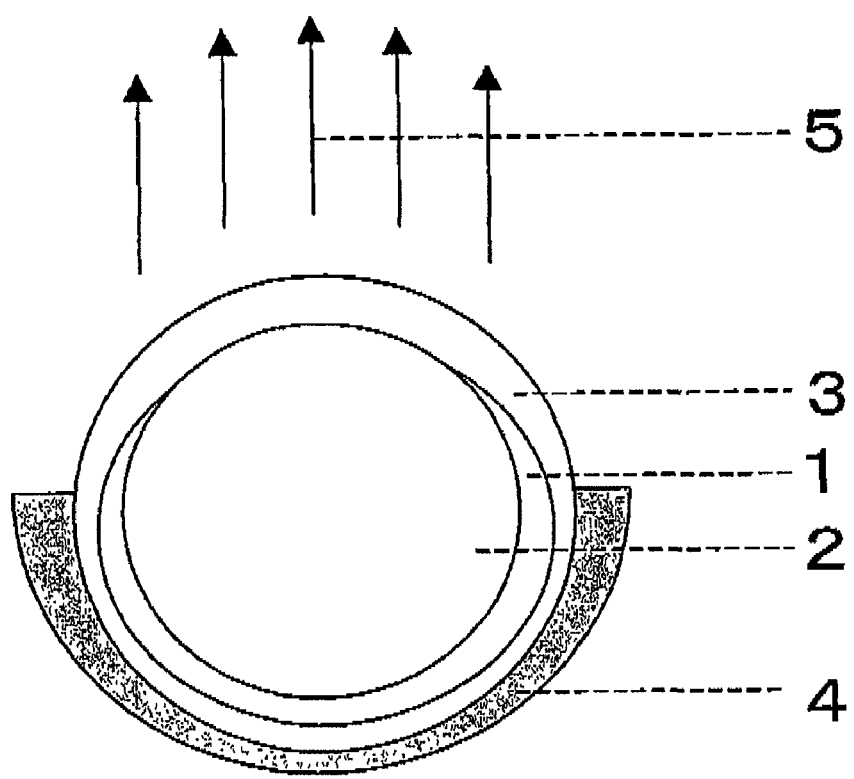
FIG. 3 shows a cross-sectional view of the light emitting device of embodiment 3.

In a light emitting device in FIG. 3, a first electrode 1 is placed on about 75% of a fiber core 2 having a circular cross section, and a light emitting layer 3 is placed on the fiber core 2 and the first electrode 1. A second electrode reflecting light is placed so as to cover about 50% of a periphery of the light emitting layer 3. Like the light emitting device in FIG. 1, the light emitting layer 3 manifests light emission when voltage is applied on the electrodes. A part of light emitted from the light emitting layer 3 is emitted from parts on which the second electrode 4 is not placed of a periphery of the light emitting layer 3, and a part thereof is emitted toward emission direction 5 from parts on which the second electrode 4 is not placed of a periphery of the light emitting layer 3 via the fiber core 2 or the first electrode 1. Other parts reach the second electrode 4 and are reflected, and emitted toward emission direction 5 from parts on which the second electrode is not placed of a periphery of the light emitting layer 3 via the fiber core 2, the first electrode 1 or the light emitting layer 3.

Embodiment 4

Figure 4:
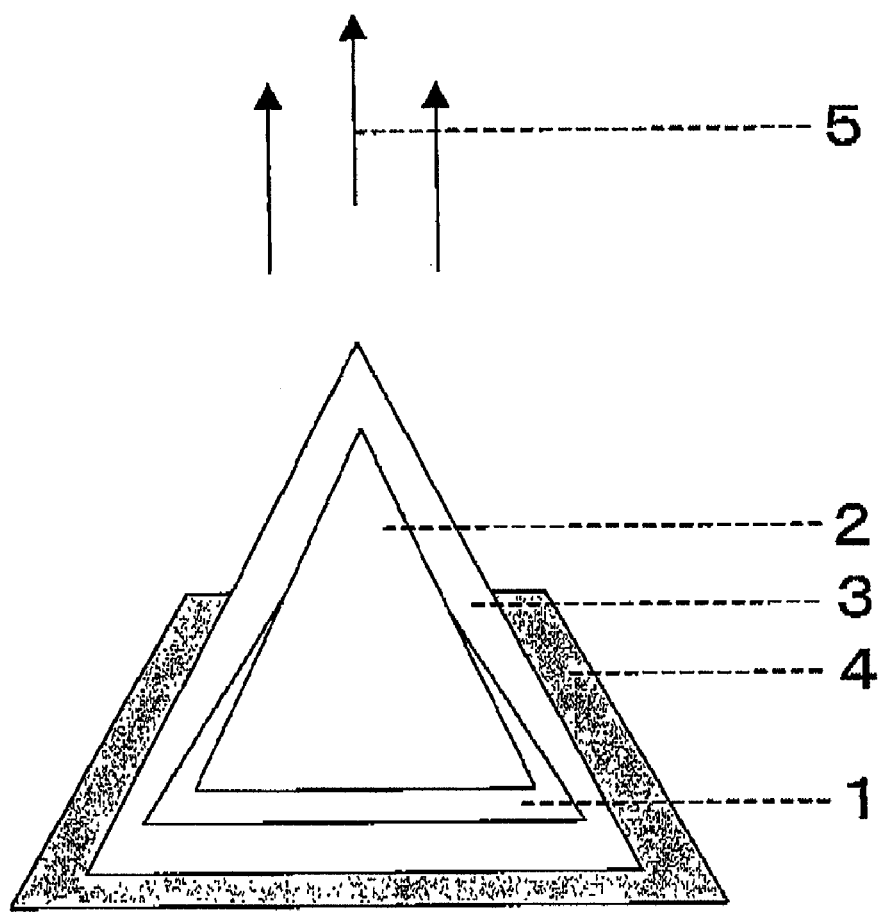
FIG. 4 shows a cross-sectional view of the light emitting device of embodiment 4.

In a light emitting device in FIG. 4, a first electrode 1 is placed on about 65% of a fiber core 2 having an isosceles triangle cross section, and a light emitting layer 3 is placed on the fiber core 2 and the first electrode 1. A second electrode reflecting light is placed so as to cover about 70% of a periphery of the light emitting layer 3. Like the light emitting device in FIG. 2, the light emitting layer 3 shows light emission when voltage is applied on the electrodes. A part of light emitted from the light emitting layer 3 is emitted from parts on which the second electrode 4 is not placed of a periphery of the light emitting layer 3, and a part thereof is emitted toward emission direction 5 from parts on which the second electrode 4 is not placed of a periphery of the light emitting layer 3 via the fiber core 2 or the first electrode 1. Other parts reach the second electrode 4 and are reflected, and emitted toward emission direction 5 from parts on which the second electrode is not placed of a periphery of the light emitting layer 3 via the fiber core 2, the first electrode 1 or the light emitting layer 3.

Embodiment 5

Figure 5:
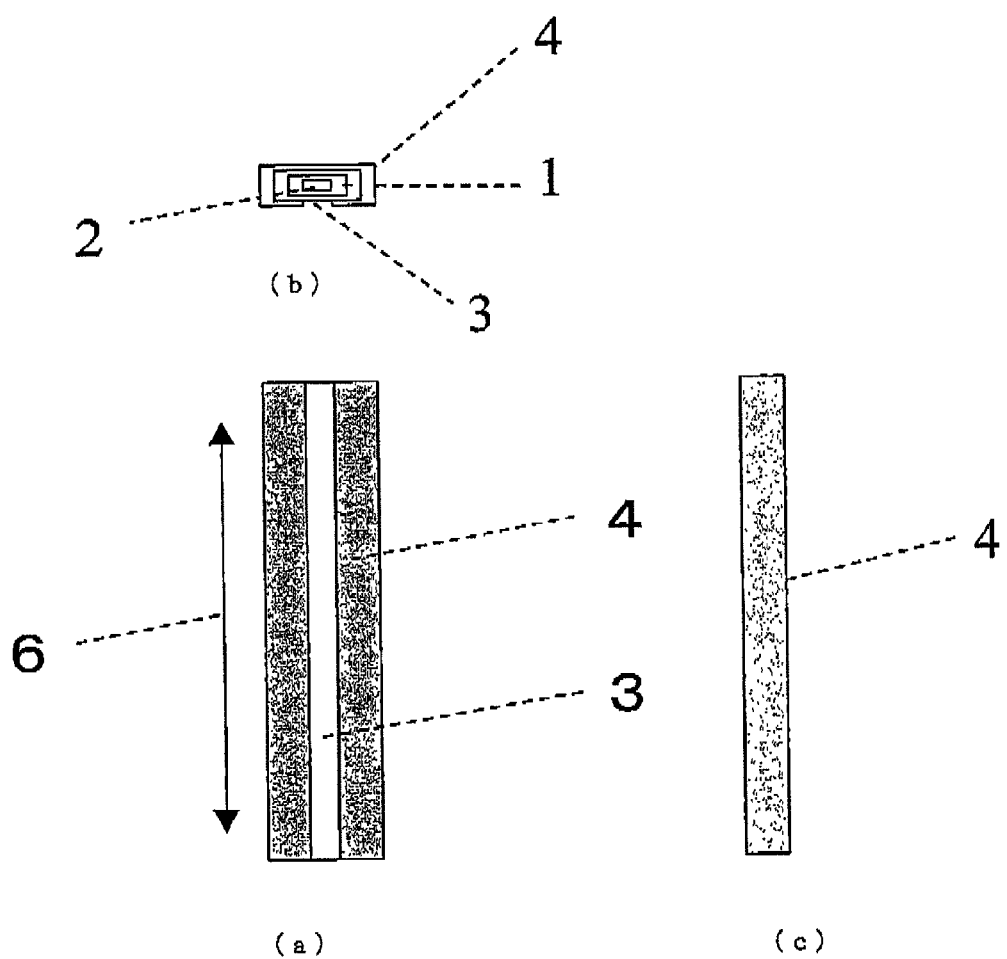
FIG. 5 shows a front view (a), top view (b) and side view (c) of the light emitting device of embodiment 5.

FIG. 5 shows a front view, a top view and a side view of a light emitting device (this is a view from the view point of light emission direction, and top to bottom direction is the longitudinal direction 6 of the light emitting device). In the light emitting device in FIG. 5, a second electrode 4 is placed in the form of belt along the longitudinal direction on a periphery of the light emitting layer 3. The second electrode 4 covers about 75% of a periphery of the light emitting layer 3. When voltage is applied on the electrodes, light from the light emitting layer 3 is emitted toward direction vertical to this paper surface. Though FIG. 5 shows a light emitting device in which the coverage of the second electrode 4 is about 75%, the coverage by the second electrode 4 may vary in the range of from 30% to 80% depending on the shape of the cross section.

Embodiment 6

Figure 6:
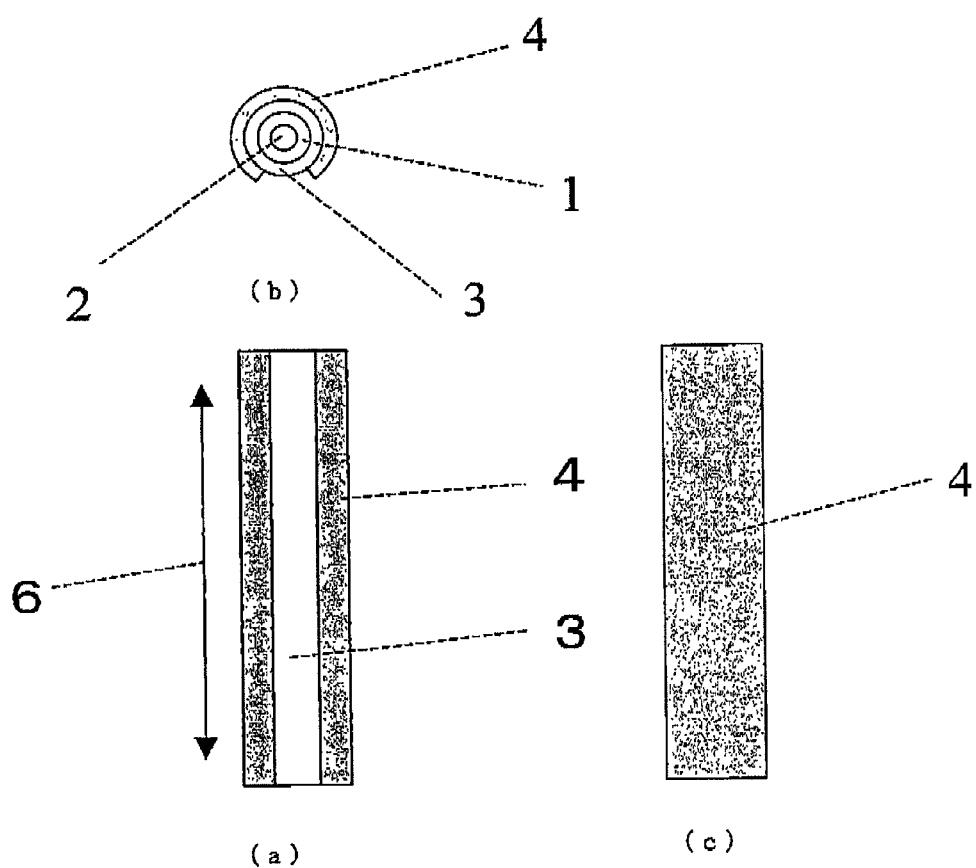
FIG. 6 shows a front view (a), top view (b) and side view (c) of the light emitting device of embodiment 6.

FIG. 6 shows a front view, a top view and a side view of a light emitting device (this is a view from the view point of light emission direction, and top-to-bottom direction is the longitudinal direction 6 of the light emitting device). In the light emitting device in FIG. 6, a second electrode 4 is placed in the form of belt along the longitudinal direction on a periphery of the light emitting layer 3. The second electrode 4 covers about 75% of a periphery of the light emitting layer 3. When voltage is applied on the electrodes, light from the light emitting layer 3 is emitted toward direction vertical to this paper surface. Though FIG. 6 shows a light emitting device in which the coverage of the second electrode 4 is about 75%, the coverage by the second electrode 4 may vary in the range of 30% to 80% depending on the shape of the cross section.

Embodiment 7

Figure 7:
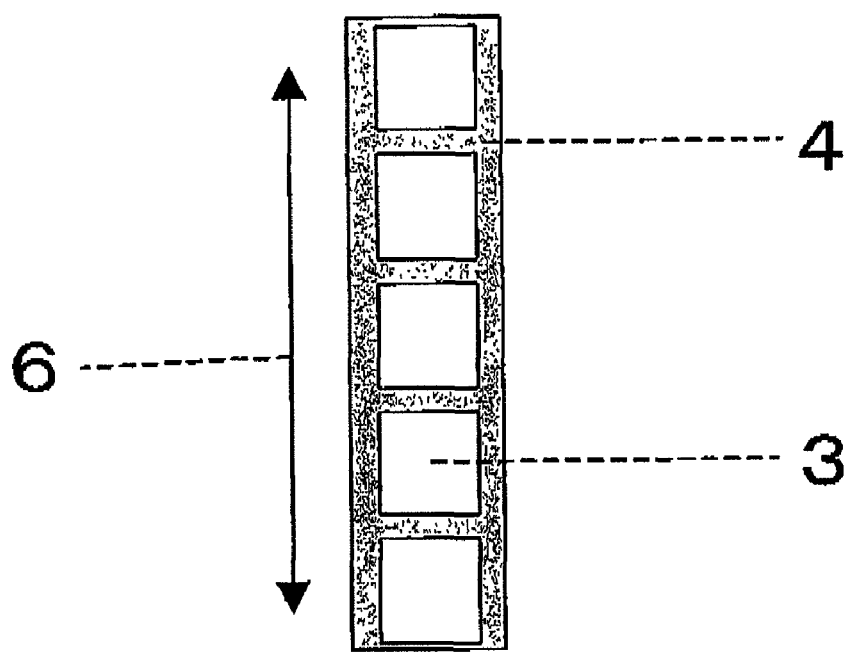
FIG. 7 shows a front view of the light emitting device of embodiment 7.

FIG. 7 shows a front view a light emitting device. In the light emitting device in FIG. 7, a first electrode (omitted in the drawing) is present on a fiber core (omitted in the drawing) and a light emitting layer 3 is present on the first electrode. A second electrode 4 covers a part (for example, about 55% to about 80%, varying depending on the shape of cross section) of a periphery of the light emitting layer 3. When voltage is applied on the electrodes, light from the light emitting layer 3 is emitted toward direction vertical to this paper surface.

Embodiment 8

Figure 8:
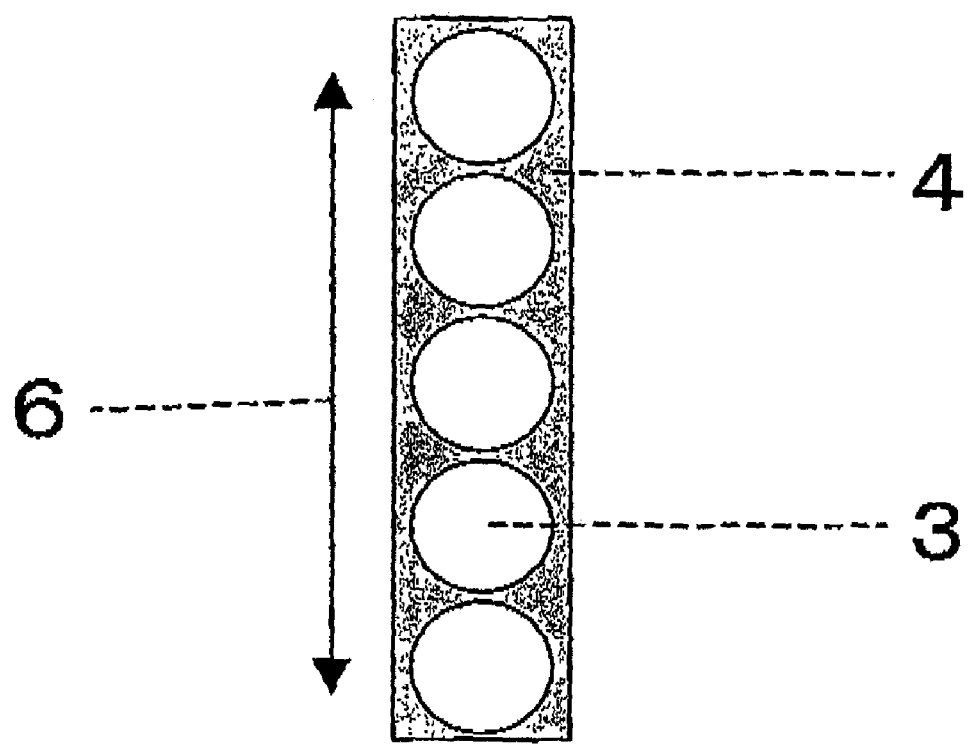
FIG. 8 shows a front view of the light emitting device of embodiment 8.

FIG. 8 shows a front view a light emitting device. In the light emitting device in FIG. 8, a first electrode (omitted in the drawing) is present on a fiber core (omitted in the drawing) and a light emitting layer 8 is present on the first electrode. A second electrode 4 covers a part (for example, about 55% to about 80%, varying depending on the shape of cross section) of a periphery of the light emitting layer 3. When voltage is applied on the electrodes, light from the light emitting layer 3 is emitted toward direction vertical to this paper surface.

Embodiment 9

A transparent electric conductive film ITO is formed by sputtering as a first electrode (anode) on the bottom surface (width: 2 mm, length: 70 mm) of an acrylic resin fiber core having a cross section in the form of isosceles triangle having an apex angle of 90° and a length of bottom side of 2 mm and having a length along the longitudinal direction of 70 mm.

The resultant member is dipped in a solution of poly(ethylenedioxythiophene)/polystyrenesulfonic acid (manufactured by Bayer, trade name "BaytronP") and dried to form a hole injection layer having a thickness of 70 nm on periphery of the fiber core and the first electrode, then, this is dipped in a toluene solution including fluorene blue high molecular weight light emitting material and dried to form an organic light emitting layer having a thickness of 80 nm.

Lithium fluoride is vapor-deposited with a thickness of about 1 nm on the bottom surface of the member, next, calcium is vapor-deposited with a thickness of about 5 nm, then, aluminum is vapor-deposited with a thickness of about 100 nm, to form a second electrode (cathode) on 41% of a periphery of the organic light emitting layer.

On a periphery of the resultant member, SiON transparent gas barrier layer is formed by sputtering to obtain a light emitting device.

Embodiment 10

A transparent electric conductive film ITO is formed by sputtering as a first electrode (anode) on a periphery of an acrylic resin fiber core having a cross section in the form of circle having a diameter of 2 mm and having a length along the longitudinal direction of 70 mm.

The resultant member is dipped in a solution of poly(ethylenedioxythiophene)/polystyrenesulfonic acid (manufactured by Bayer, trade name "BaytronP") and dried to form a hole injection layer having a thickness of 70 nm on a periphery of the fiber core, then, this is dipped in a toluene solution including a fluorene blue high molecular weight light emitting material and dried to form an organic light emitting layer having a thickness of 80 nm.

On the resultant member, lithium fluoride is vapor-deposited with a thickness of about 1 nm, calcium is vapor-deposited with a thickness of about 5 nm, then, aluminum is vapor-deposited with a thickness of about 100 nm, from one direction, to form a second electrode (cathode) on 50% of a periphery of the organic light emitting layer.

On a periphery of the resultant member, SiON transparent gas barrier layer is formed by sputtering to obtain a light emitting device.

Figure 9:
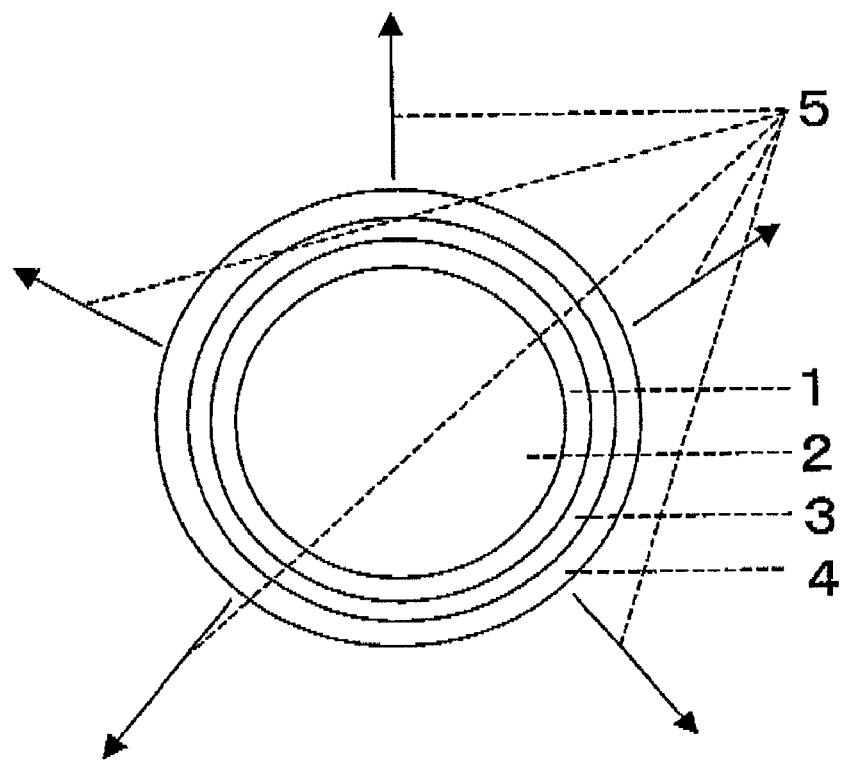
FIG. 9 shows a croon-sectional view of a conventional light emitting device.

The light emitting devices described above as embodiments show higher brightness in comparison with the light emitting device as shown in FIG. 9 in which the first electrode 1 and the light emitting layer 3 are placed on the fiber core 2, and the second electrode is transparent and placed on all of a periphery of the light emitting layer, when the view point is fixed (View point is set above the light emitting devices of embodiments 1 to 4. In the light emitting devices of embodiments 5 to 8, view point is set on the side facing the front view. In the light emitting devices of embodiments 9 to 10, view point is set on the side facing a periphery of the organic light emitting layer on which the second electrode is not formed.).

The light emitting devices have sufficient mechanical strength and flexibility. Therefore, direction of an open portion of a light emitting device (light emission direction) can be easily fixed to the direction of the view point.

2. Sheet Light Emitting Device

The sheet light emitting device of the present invention includes the above-described light emitting device. In the sheet light emitting device, for example, a plurality of light emitting devices may be woven to give a sheet. Alternatively, the longitudinal directions thereof may be regularly fixed to give a sheet. Further, two or more light emitting devices having different light emitting layers may be combined. In these devices, it is preferable that the light emitting devices show regular light emission directions.

3. Display, Lighting

A display includes, for example, a light emitting device (for example, three kinds of light emitting devices having different light emitting layers such as a red light emitting device, green light emitting device and blue light emitting device) in which the light emitting devices show regular light emission directions, and usually includes three kinds of light emitting devices of different light emitting layers in which the light emitting devices show regular light emission directions, and includes a circuit for controlling these light emitting devices and light emission of these light emitting devices. According to a display having such components, a full color thin poster and the like are provided.

A lighting includes, for example, light emitting devices (for example, light emitting devices containing a red organic light emitting layer, green organic light emitting layer and blue organic light emitting layer) in which the light emitting devices show regular light emitting directions, and usually includes a circuit for controlling these light emitting devices and light emitting devices. According to a lighting having such components, white lighting which may be placed arbitrarily on wall surfaces having complicated shape such as a curved surface and the like are provided.

INDUSTRIAL APPLICABILITY

According to the present invention, a light emitting device with high brightness is provided. Further, according to the invention, a sheet light emitting device, display and lighting, with high brightness, are provided.

The invention claimed is:

1. A light emitting device comprising a fiber core, a first electrode, a light emitting layer and a second electrode in this order
wherein the light emitting layer is on at least one selected from the fiber core and the first electrode,
the second electrode is opaque, and is on a periphery of the light emitting layer and covers not less than 30% and not more than 80% of a periphery of the light emitting layer,
and the fiber core has a cross-sectional shape of an ellipse or a polygon, or has a hollow shape,
wherein the ellipse has a major diameter and a minor diameter, the major diameter being greater than the minor diameter,
wherein the fiber core has a periphery having an asperity.

2. The light emitting device according to claim 1, wherein the fiber core includes a metal, glass or plastic.

3. The light emitting device according to claim 1, wherein the fiber core is transparent.

4. The light emitting device according to claim 1, wherein the first electrode is transparent.

5. The light emitting device according to claim 1, wherein the first electrode is an anode.

6. The light emitting device according to claim 5, wherein the first electrode includes an electrically conductive metal oxide, metal or electrically conductive an organic compound.

7. The light emitting device according to claim 1, wherein the light emitting layer includes an organic compound.

8. The light emitting device according to claim 7, wherein the light emitting layer includes a low molecular weight compound or high molecular weight compound.

9. The light emitting device according to claim 1, wherein the second electrode is a cathode.

10. The light emitting device according to claim 9, wherein the second electrode includes a metal selected from the group consisting of lithium, sodium, potassium, rubidium, cesium, beryllium, magnesium, calcium, strontium, barium, aluminum, scandium, vanadium, zinc, yttrium, indium, cerium, samarium, europium, terbium and ytterbium, an alloy of these metals, an alloy of at least one of these metals and at least one selected from gold, silver, platinum, copper, manganese, titanium, cobalt, nickel, tungsten and tin, graphite or graphite intercalation compound.

11. The light emitting device according to claim 1, wherein the light emitting device further comprises a gas barrier layer.

12. A sheet light emitting device, comprising the light emitting device according to claim 1.

13. The sheet light emitting device according to claim 12, wherein the light emitting device shows regular light emitting direction.

14. A display comprising the light emitting device according to claim 1 wherein the light emitting device shows regular light emission direction.

15. The display according to claim 14, wherein the light emitting device comprises a red light emitting device, green light emitting device and blue light emitting device.

16. A lighting comprising the light emitting device according to claim 1 wherein the light emitting device shows regular light emitting direction.

17. The lighting according to claim 16, wherein the light emitting device comprises an organic light emitting layer.

18. The lighting according to claim 17, wherein the light emitting device comprises a red organic light emitting layer, green organic light emitting layer and blue organic light emitting layer.

19. A sheet light emitting device, comprising the light emitting device according to claim 1, wherein the sheet light emitting device comprises a weave composed of a plurality of the light emitting devices or wherein longitudinal directions of a plurality of the light emitting devices are regularly fixed to give the sheet.

* * * * *